(12) United States Patent
Yang et al.

(10) Patent No.: US 9,728,413 B2
(45) Date of Patent: Aug. 8, 2017

(54) METHOD FOR PREPARING FILM PATTERNS

(71) Applicants: BOE Technology Group Co., Ltd., Beijing (CN); CHENGDU BOE OPTOELECTRONICS TECHNOLOGY CO., LTD., Chengdu (CN)

(72) Inventors: Yuqing Yang, Beijing (CN); Seung Yik Park, Beijing (CN); Byung Chun Lee, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 300 days.

(21) Appl. No.: 14/400,931

(22) PCT Filed: Dec. 4, 2013

(86) PCT No.: PCT/CN2013/088556
§ 371 (c)(1),
(2) Date: Nov. 13, 2014

(87) PCT Pub. No.: WO2015/039383
PCT Pub. Date: Mar. 26, 2015

(65) Prior Publication Data
US 2016/0260614 A1    Sep. 8, 2016

(30) Foreign Application Priority Data
Sep. 22, 2013  (CN) .......................... 2013 1 0432089

(51) Int. Cl.
*H01L 21/283*  (2006.01)
*H01L 21/285*  (2006.01)
(Continued)

(52) U.S. Cl.
CPC .......... *H01L 21/2855* (2013.01); *G06F 3/041* (2013.01); *H01L 21/0331* (2013.01);
(Continued)

(58) Field of Classification Search
CPC ............... H01L 27/124; H01L 27/3276; H01L 2924/01322; H01L 21/4867;
(Continued)

(56) References Cited

U.S. PATENT DOCUMENTS 7,718,903 B2 * 5/2010 Murai .................. H05K 3/1258
174/255
2005/0089803 A1 * 4/2005 Bouaidat .............. C12N 5/0068
430/312
(Continued)

FOREIGN PATENT DOCUMENTS

CN    2579656 Y    10/2003
CN    1901204 A    1/2007
(Continued)

OTHER PUBLICATIONS

Jan. 5, 2016—(CN)—Second Office Action Appn 201310432089.4 with English Tran.
(Continued)

*Primary Examiner* — Bac Au
(74) *Attorney, Agent, or Firm* — Banner & Witcoff, Ltd.

(57) ABSTRACT

A method for preparing film patterns; firstly, a complementary film pattern (1) to a desired film pattern (201) is prepared on a substrate (3) with an erasable agent; secondly, a whole layer of film (2) is formed on the complementary film pattern (1); and thirdly, the desired film pattern (201) is obtained by removing the complementary film pattern (1). The preparation method can simplify the production process and reduce the production cost of the film patterns.

12 Claims, 3 Drawing Sheets

(51) Int. Cl.
   *H01L 31/18* (2006.01)
   *G06F 3/041* (2006.01)
   *H01L 21/033* (2006.01)
   *H01L 21/28* (2006.01)
   *H01L 27/12* (2006.01)
   *H01L 29/43* (2006.01)

(52) U.S. Cl.
   CPC .... *H01L 21/28008* (2013.01); *H01L 27/1259* (2013.01); *H01L 29/43* (2013.01); *H01L 31/1884* (2013.01); *G06F 2203/04103* (2013.01); *H01L 2924/0002* (2013.01); *Y02E 10/50* (2013.01)

(58) Field of Classification Search
   CPC ........... H01L 23/49883; H01L 51/0003; H01L 51/0004; H01L 51/0005; H01L 51/0007; H01L 51/0023; H01L 51/0035
   See application file for complete search history.

(56) References Cited

U.S. PATENT DOCUMENTS

2006/0220877 A1* 10/2006 Ferguson ......... G06K 19/07718
                                                        340/572.7
2014/0152579 A1* 6/2014 Frey ....................... G06F 3/044
                                                        345/173

FOREIGN PATENT DOCUMENTS

| CN | 101391552 A | 3/2009 |
| CN | 101572999 B | 3/2012 |
| JP | 2003029639 A | 1/2003 |

OTHER PUBLICATIONS

Peter Van Zant, "Chip Manufacturing—Useful Course for Semiconductor Technology Manufacturing Process", Electronic Industry Press, pp. 274-279, Oct. 31, 2004.
International Search Report mailed Jun. 25, 2014 (PCT/CN2013/088556); ISA/CN.
Jul. 13, 2015—(CN)—First Office Action Appn 2013104320894 with English Tran.
Mar. 22, 2016—International Preliminary Report on Patentability Appn PCT/CN2013/088556.
Jun. 1, 2016—(CN) Third Office Action (with English Translation)—App. No. 201310432089.4.

* cited by examiner

METHOD FOR PREPARING FILM PATTERNS

The application is a U.S. National Phase Entry of International Application PCT/CN2013/088556 filed on Dec. 4, 2013, designating the United States of America and claiming priority to Chinese Patent Application No. 201310432089.4, filed on Sep. 22, 2013. The present application claims priority to and the benefit of all the above-identified applications and all of the above-identified applications are incorporated by reference herein in their entireties.

TECHNICAL FIELD

Embodiments of the present invention relate to a method for preparing film patterns.

BACKGROUND

Currently, in the processes of manufacturing devices such as liquid crystal displays (LCDs), electroluminescence devices (ELDs), touch screen modules and solar batteries, patterns of corresponding components can be formed by means of films. For instance, in the processes of manufacturing components in an LCD such as a gate electrode, a source electrode, a drain electrode and a pixel electrode and a touch electrode of a capacitive touch module, patterns of the components can be prepared with corresponding films.

The traditional methods for preparing film patterns generally include a masking process. For instance, in the process of manufacturing a touch electrode of a capacitive touch module, generally, firstly, an indium tin oxide (ITO) film is formed on a base substrate by magnetron sputtering; secondly, a photoresist film is coated on the ITO film; thirdly, the photoresist film is exposed via a mask pattern and developed to obtain a photoresist pattern; fourthly, the ITO film is wet-etched with the photoresist pattern; and fifthly, the remaining photoresist is stripped to obtained a required pattern of the touch electrode.

As can be seen, the traditional method for preparing the film patterns is complex. Moreover, as the cost of a mask used in the preparation process is high, the cost of preparing the film patterns is also high. Therefore, how to simplify the preparation steps of the film patterns and reduce the production cost of the film patterns is a technical problem to be solved by those skilled in the art.

SUMMARY

An embodiment of the present invention provides a method for preparing film patterns to solve the problems of complex preparation steps and high costs in the traditional method for preparing film patterns.

An embodiment of the present invention provides a method for preparing film patterns, which comprises: forming a first film pattern on a substrate with an erasable agent; preparing a second film on the substrate provided with the first film pattern; and removing the first film pattern on the substrate and an area of the second film covering the first film pattern and obtaining a second film pattern complementary to the first film pattern.

For instance, the first film pattern is formed on the substrate by a pattern drawing or printing process.

For instance, the second film is prepared on the substrate provided with the first film pattern by a film coating process. For instance, the second film is a transparent conductive oxide film or a metal film. For instance, the transparent conductive oxide film is an ITO film.

For instance, the first film pattern on the substrate and the area of the second film covering the first film pattern are removed by an erasing means or a cleaning agent.

For instance, the cleaning agent and the erasable agent have a same polarity. For instance, the erasable agent may be ink and the cleaning agent may be ethanol or acetone solution.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

The thicknesses of films in the accompanying drawings do not reflect the true scale thereof. The shapes of film patterns are not limited thereto. The objective is to illustrate the content of the present invention.

Figure 1:
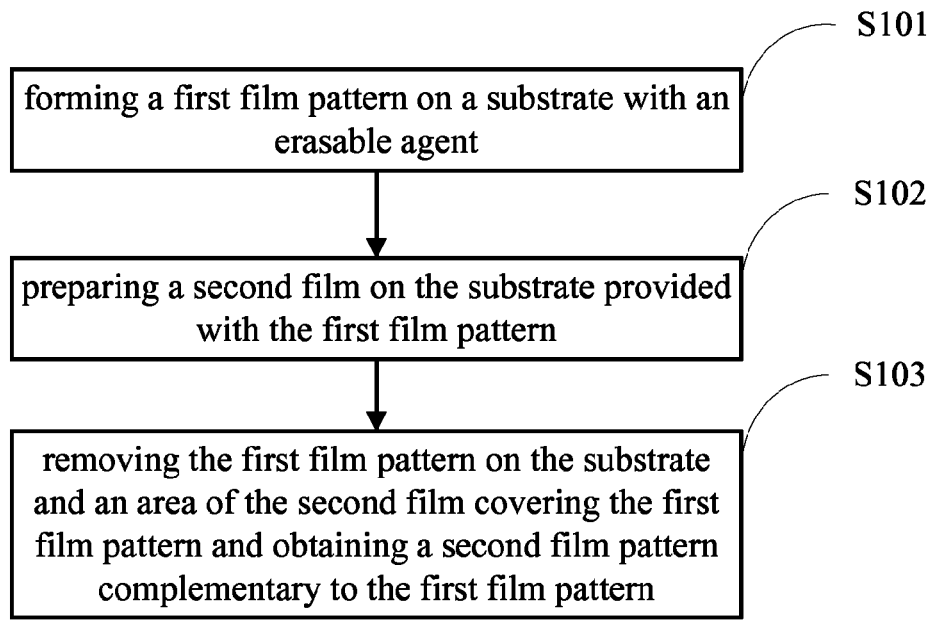
FIG. 1 is a flowchart of a method for preparing film patterns provided by an embodiment of the present invention.

An embodiment of the present invention provides a method for preparing film patterns. As illustrated in FIG. 1, the method may be conducted as follows:

S101: forming a first film pattern on a substrate with an erasable agent;

S102: preparing a second film on the substrate provided with the first film pattern; and S103: removing the first film pattern on the substrate and an area of the second film covering the first film pattern and obtaining a second film pattern complementary to the first film pattern.

For instance, the substrate described in the above preparation method may be a base substrate and may also be a substrate provided with other films. No limitation will be given here.

In the method for preparing the film patterns provided by an embodiment of the present invention, firstly, a film pattern complementary to a desired film pattern is prepared on a substrate with an erasable agent; secondly, a whole layer of film is formed on the complementary film pattern; and thirdly, a desired film pattern is obtained by removing the complementary film pattern. Compared with the traditional method for preparing film patterns by means of a mask, the processes such as exposure, development, etching and stripping are not required any more, and hence the preparation process can be simplified. Moreover, the mask is not required in the preparation process, and hence the production cost of the film patterns can be reduced.

The preparation method provided by the embodiment of the present invention may be used for preparing film patterns in devices such as LCDs, ELDs, touch screen modules and solar batteries. For instance, the preparation method provided by the embodiment of the present invention may be used for preparing patterns of components in an LCD such as a gate electrode, a source electrode, a drain electrode and a pixel electrode.

In addition, the preparation method provided by the embodiment of the present invention is particularly suitable for preparing a pattern of a touch electrode in a capacitive touch module. The steps of the preparation method provided by the embodiment of the present invention are described below in detail by taking the method for preparing the pattern of the touch electrode in the capacitive touch module as an example.

For instance, in the preparation method provided by the embodiment of the present invention, the first film pattern is formed on the substrate by use of the erasable agent in the step S101. The first film pattern may be formed on the substrate by, for instance, a pattern drawing or printing process.

Figure 2:
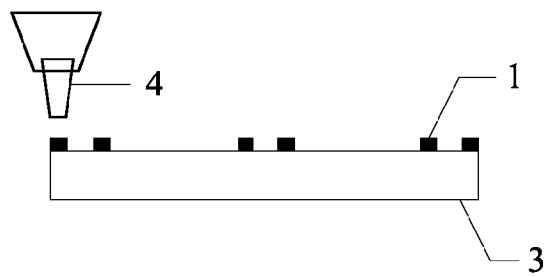
FIG. 2 is a first schematic diagram illustrating the process of preparing a first film pattern on a substrate provided by an embodiment of the present invention.
Figure 3:
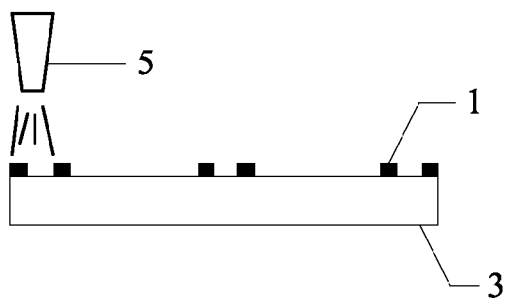
FIG. 3 is a second schematic diagram illustrating the process of preparing the first film pattern on the substrate provided by an embodiment of the present invention.

As illustrated in FIG. 2, a first film pattern 1 may be drawn on a substrate 3 via a marker pen 4 in a manual or automatic control way. As illustrated in FIG. 3, the first film pattern 1 may be also formed on the substrate 3 via, for instance, an ink gun 5 by an inkjet printing process. For instance, the locus or route of the marker pen 4 or the ink gun 5 can be designed by means of pattern design via computer programming, and hence the first film pattern 1 can be prepared. Of course, the first film pattern may be also formed on the substrate by other similar means. For instance, the first film pattern is formed on the substrate by screen printing, conventional offset printing or digital printing as long as the formed first film pattern is erasable. Specific processes are not limited herein.

When the first film pattern is formed in the above-mentioned ways, for instance, the ink for drawing and printing the pattern is prepared by an erasable agent. The erasable agent generally comprises a composite solution of a dispersant, an erasable agent, a solution and the like. For instance, the dispersant may be polymeric polycarboxylic acid salt or fatty acyl diethanol amine; the erasable agent may be a long-chain fatty acid ester; and the solution may be polyvinyl alcohol (PVA) or lower alcohol.

Figure 4:
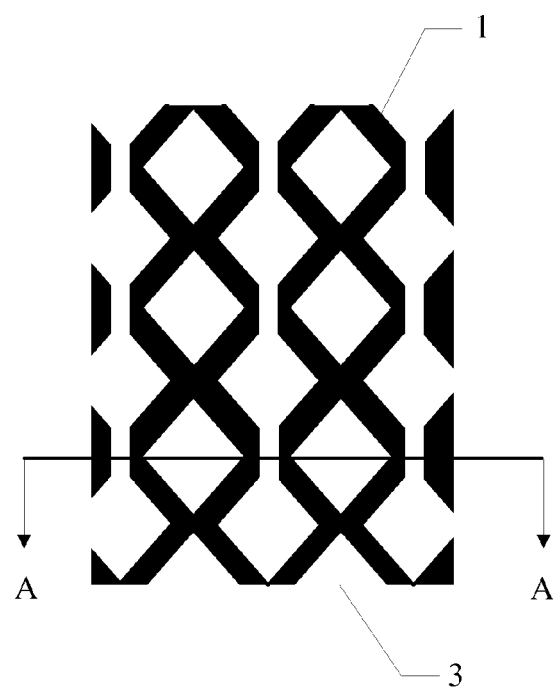
FIG. 4 is a schematic structural view illustrating the process after the first film pattern has been prepared on the substrate provided by an embodiment of the present invention.

The first film pattern 1 prepared in the step S101 is as shown by a black shaded portion in FIG. 4 and is a complementary pattern of a desired touch electrode pattern. A white portion represents the desired touch electrode pattern. FIGS. 2 and 3 are sectional views of FIG. 4 along the AA direction.

Figure 5:
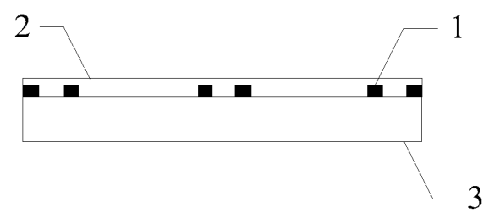
FIG. 5 is a schematic structural view illustrating the process after a second film is prepared on the substrate provided by an embodiment of the present invention.

In the preparation method provided by an embodiment of the present invention, the second film is prepared on the substrate 3 provided with the first film pattern 1 in the step 102. For instance, the second film is prepared on the substrate provided with the first film pattern by a film coating process. For instance, as illustrated in FIG. 5, a second film 2 may be prepared on the substrate 3 provided with the first film pattern 1 by magnetron sputtering, evaporation coating or other coating processes. Preferably, in order to avoid the problem of the solidification of the first film pattern 1 when the first film pattern 1 is placed in a high-temperature environment, the second film 2 may be prepared on the substrate 3 provided with the first film pattern 1 by other low-temperature film coating processes. In the process of preparing the second film 2 on the substrate 3 provided with the first film pattern 1, the temperature of the substrate 3 is preferably controlled to be less than 200 centigrade (° C.). Of course, the specific film coating process can be any suitable process selected according to the substrate and film materials. No limitation will be given here.

Moreover, the prepared second film 2 may be a transparent conductive oxide film or may be a metal film.

For instance, the metal film may be made of a metal such as chromium, nickel, titanium, nickel-chromium alloy, aluminum, zinc, gold, silver, copper, or the like. The metal film may be a single layer and also may be of a multilayer structure stacking more than two different metal layers. The transparent conductive oxide film may be an ITO film and also may be a transparent conductive oxide film with other similar properties, e.g., indium zinc oxide (IZO), zinc aluminum oxide (ZAO) or the like. No limitation will be given here.

Figure 6:
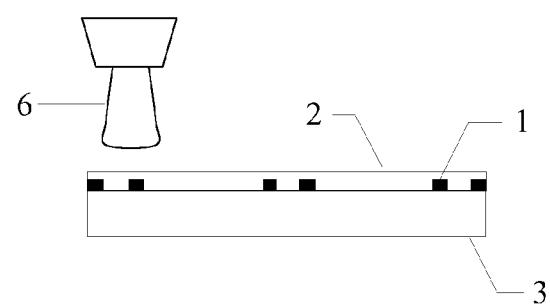
FIG. 6 is a first schematic diagram illustrating the process of removing the first film pattern on the substrate provided by an embodiment of the present invention.
Figure 7:
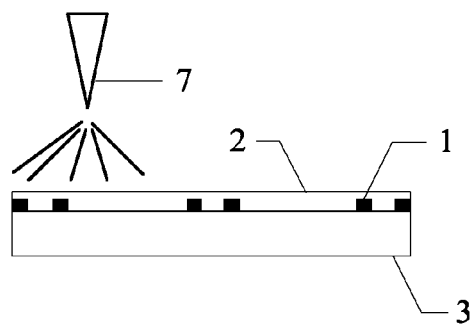
FIG. 7 is a second schematic diagram illustrating the process of removing the first film pattern on the substrate provided by an embodiment of the present invention.

In the above method provided by the embodiment of the present invention, the first film pattern 1 on the substrate 3 and the area of the second film 2 covering the first film pattern 1 are removed in the step S103. As illustrated in FIG. 6, the first film pattern 1 on the substrate 3 and the corresponding area of the second film 2 covering the first film pattern 1 can be removed by an erasing means via an erasing head 6 made of a material such as cloth, silk, plastic, metal or the like. As illustrated in FIG. 7, the first film pattern 1 on the substrate 3 and the area of the second film 2 covering the first film pattern 1 may also be removed by spraying a cleaning agent via, for instance, a spray head 7.

Figure 8:
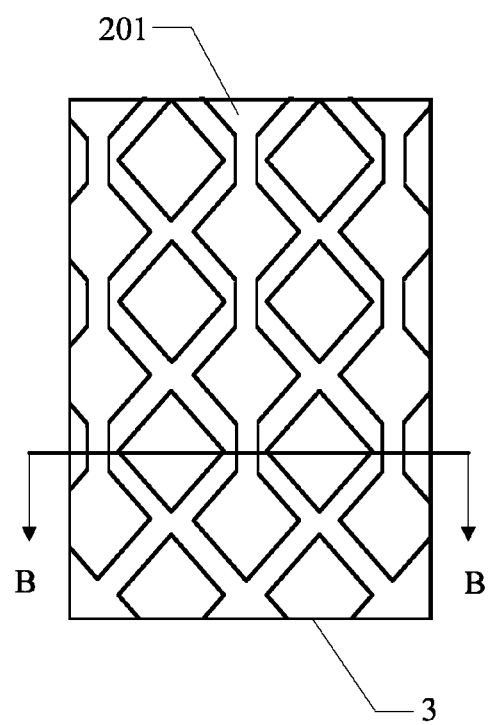
FIG. 8 is a schematic structural view illustrating the process after the first film pattern on the substrate has been removed provided by an embodiment of the present invention.
Figure 9:
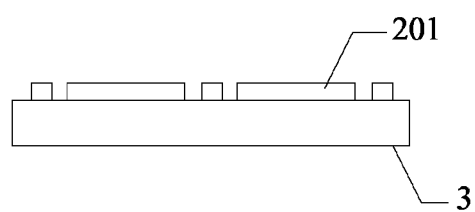
FIG. 9 is a sectional view of FIG. 8 along BB direction.

In the cleaning process, the first film pattern 1 prepared on the substrate 3 by adoption of, for instance, ink as the erasable agent can be dissolved in the cleaning agent or erased by the erasing head 6 without any residue. Meanwhile, other substances covering the first film pattern 1, namely the corresponding area of the second film 2, will also be removed together with the removal of the ink, and hence the desired second film pattern 201 complementary to the first film pattern 1 is obtained, as illustrated in FIGS. 8 and 9. FIG. 9 is a sectional view of FIG. 8 along the BB direction. The second film pattern 201 and the first film pattern 1 are complementary patterns.

Furthermore, according to the principle of similarity-intermiscibility, the cleaning agent and the erasable agent must have the same polarity, namely the erasable agent can be dissolved in the cleaning agent.

For instance, the erasable agent may be ink, and the cleaning agent may be ethanol or acetone solution. The cleaning agent may also be a mixture of 96% alcohol, 10% aqueous ammonia and water according to the volume proportion of 1:1:1. Or acetone or oxydol is used as the cleaning agent to remove the first film pattern. The main components of the ink may include an organic solvent, a surface active agent, a solvent, a dispersant, deionized water and a PH regulator. Of course, other chemical preparation may also be taken as the erasable agent and the cleaning agent. No limitation will be given here.

Compared with the traditional method for preparing film patterns with a mask, the method for preparing the film patterns provided by an embodiment of the present invention, saves the processes such as exposure, development, etching and stripping and simplifies the preparation process. Moreover, as the mask is not required in the preparation process, the production cost of the film patterns can be reduced.

The foregoing is only the preferred embodiments of the present invention and not intended to limit the scope of protection of the present invention. The scope of protection of the present invention should be defined by the appended claims.

The invention claimed is:

1. A method for preparing film patterns, comprising:
    forming a first film pattern with an erasable formulation on a substrate;
    preparing a second film on the substrate provided with the first film pattern; and
    removing the first film pattern on the substrate and an area of the second film covering the first film pattern and obtaining a second film pattern complementary to the first film pattern,
    wherein the erasable formulation comprises a composite solution of a dispersant, an erasable agent and a solution; the dispersant is polymeric polycarboxylic acid salt or fatty acyl diethanol amine; the erasable agent is a long-chain fatty acid ester; and the solution is polyvinyl alcohol (PVA) or lower alcohol.

2. The method according to claim 1, wherein the first film pattern is formed on the substrate by a pattern drawing or printing process.

3. The method according to claim 2, wherein the second film is prepared on the substrate provided with the first film pattern by a film coating process.

4. The method according to claim 3, wherein the second film is a transparent conductive oxide film or a metal film.

5. The method according to claim 4, wherein the transparent conductive oxide film is an indium tin oxide (ITO) film.

6. The method according to claim 2, wherein the first film pattern on the substrate and the area of the second film covering the first film pattern are removed by an erasing means or a cleaning agent.

7. The method according to claim 6, wherein the cleaning agent and the erasable agent have a same polarity.

8. The method according to claim 1, wherein the second film is prepared on the substrate provided with the first film pattern by a film coating process.

9. The method according to claim 8, wherein the second film is a transparent conductive oxide film or a metal film.

10. The method according to claim 9, wherein the transparent conductive oxide film is an indium tin oxide (ITO) film.

11. The method according to claim 1, wherein the first film pattern on the substrate and the area of the second film covering the first film pattern are removed by an erasing means or a cleaning agent.

12. The method according to claim 11, wherein the cleaning agent and the erasable agent have a same polarity.

* * * * *